(12) United States Patent
Keranen et al.

(10) Patent No.: US 9,801,273 B2
(45) Date of Patent: *Oct. 24, 2017

(54) MULTILAYER STRUCTURE AND RELATED METHOD OF MANUFACTURE FOR ELECTRONICS

(71) Applicant: Tacto Tek Oy, Kempele (FI)

(72) Inventors: Antti Keranen, Oulu (FI); Jarmo Saaski, Kempele (FI); Mikko Heikkinen, Oulu (FI)

(73) Assignee: TactoTek Oy, Kempele (FI)

( * ) Notice: Subject to any disclaimer, the term of this patent is extended or adjusted under 35 U.S.C. 154(b) by 0 days.

This patent is subject to a terminal disclaimer.

(21) Appl. No.: 15/343,731

(22) Filed: Nov. 4, 2016

(65) Prior Publication Data

US 2017/0135198 A1 May 11, 2017

Related U.S. Application Data

(60) Provisional application No. 62/251,981, filed on Nov. 6, 2015.

(51) Int. Cl.
  *H05K 1/00* (2006.01)
  *H05K 1/02* (2006.01)
  (Continued)

(52) U.S. Cl.
  CPC ........... *H05K 1/028* (2013.01); *H05K 1/0274* (2013.01); *H05K 1/111* (2013.01); *H05K 1/16* (2013.01);
  (Continued)

(58) Field of Classification Search
  USPC .............................. 361/749, 748, 750, 679.5
  See application file for complete search history.

(56) References Cited

U.S. PATENT DOCUMENTS

| 6,137,224 | A | 10/2000 | Centofante |
| 2005/0073018 | A1 | 4/2005 | Yano et al. |

(Continued)

FOREIGN PATENT DOCUMENTS

| EP | 1734800 | 12/2006 |
| JP | 05082921 | 4/1993 |

OTHER PUBLICATIONS

Notification of Transmittal of the International Search Report and the Written Opinion of the International Searching Authority, or the Declaration PCT/FI2016/050778 dated Feb. 16, 2017.

(Continued)

*Primary Examiner* — Andargie M Aychillhum
(74) *Attorney, Agent, or Firm* — Robert P. Michal, Esq.; Carter, DeLuca, Farrell & Schmidt, LLP

(57) ABSTRACT

A multilayer structure (200) including a preferably flexible substrate film (102) capable of accommodating electronics (106, 108), such as conductive traces and optionally electronic components such as SMDs (surface-mount device), on a first side thereof, the film having the first side and a second side, and a plastic layer (204) molded onto the first side of the substrate and protruding at one or more locations (114, 114B) through the substrate onto the second side, forming one or more protrusions (218) on the second side having a predetermined function. A corresponding method of manufacture is presented.

20 Claims, 2 Drawing Sheets

(51) Int. Cl.
  *H05K 1/11*  (2006.01)
  *H05K 1/16*  (2006.01)
  *H05K 1/18*  (2006.01)
  *H05K 3/00*  (2006.01)
  *H05K 3/28*  (2006.01)

(52) U.S. Cl.
  CPC ........... *H05K 1/181* (2013.01); *H05K 3/0044* (2013.01); *H05K 3/284* (2013.01); *H05K 2201/10106* (2013.01); *H05K 2201/10143* (2013.01); *H05K 2201/10151* (2013.01); *H05K 2203/1105* (2013.01); *H05K 2203/1316* (2013.01); *H05K 2203/1327* (2013.01); *H05K 2203/166* (2013.01)

(56) References Cited

U.S. PATENT DOCUMENTS

| | | |
|---|---|---|
| 2009/0017242 A1 | 1/2009 | Weber et al. |
| 2009/0154182 A1 | 6/2009 | Veenstra et al. |
| 2011/0175102 A1* | 7/2011 | Hatano ............... H01L 51/5243 257/72 |
| 2012/0070921 A1 | 3/2012 | Thompson et al. |
| 2012/0106095 A1 | 5/2012 | Daniel |
| 2012/0201007 A1 | 8/2012 | Yeh et al. |

OTHER PUBLICATIONS

Overmolding Guide [online]. GLS Corporation, 2004 [retrieved on Feb. 13, 2017]. Retrieved from <http://www.polyone.com/files/resources/Overmold_Design_Guide.pdf>.

* cited by examiner

MULTILAYER STRUCTURE AND RELATED METHOD OF MANUFACTURE FOR ELECTRONICS

FIELD OF THE INVENTION

Generally the present invention relates to multi-layer structures, electronics, associated devices, and methods of manufacture. In particular, however not exclusively, the present invention concerns provision of different functional forms from molded plastics in the above context.

BACKGROUND OF THE INVENTION

Generally there exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multi-layer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, e.g. ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through substantially additive printing process. The used substrates may be flexible and printed materials organic, which is however, not necessarily always the case.

A substrate such as a plastic substrate film, may be subjected to processing like (thermo)forming and molding. Indeed, using e.g. injection molding a plastic layer may be provided on the film, potentially then embedding a number of elements such as electronic components initially provided on the film. The plastic layer may have different mechanical, optical, electrical, etc. properties. It may simply secure or protect underlying elements, provide desired feel or appearance to the product such as color. The molded plastic layer may further be covered by additional elements or e.g. a foil or film, which may contain e.g. graphical patterns obtained by IML/IMD techniques.

The obtained multilayer, or stacked, structure may be configured for a variety of purposes depending on the included features such as electronics and the intended use scenario and related use environment. Different optical, sensing, or e.g. attachment functionalities may be required. Typically such functionalities are provided by dedicated elements specifically included in the structure. Increasing the overall number of elements in the stack tends to increase the complexity, time span and cost of the associated manufacturing process, while reducing the integration level and increasing the size and weight of the overall structure.

SUMMARY OF THE INVENTION

The objective of the present invention is to at least alleviate one or more of the above drawbacks associated with the existing solutions in the context of integral multilayer structures and electronics embedded therein.

The objective is achieved with various embodiments of a multilayer structure and related method of manufacture in accordance with the present invention.

According to one embodiment of the present invention, a multilayer structure for an electronic or optical device comprises a preferably flexible substrate film capable of accommodating electronics, such as conductive traces and optionally electronic components such as SMDs (surface-mount device), on a first side thereof, said film having the first side and a second side, and a plastic layer molded onto the first side of the substrate and protruding at one or more locations through the substrate onto the second side, forming one or more protrusions on the second side having a predetermined function.

Preferably, the one or more plastic protrusions extend over and from the second side of the substrate so that they together cover only a portion of the second side and related surface. Part of the second side/surface thus remains free from the molded plastic. The first side and related (first) surface may be completely or partially covered by the plastic.

In one embodiment, one or more of the protrusions have been configured to implement at least part of at least one feature or function selected from the group consisting of: light transmitting function, light receiving function, prismatic function, light coupling function, light outcoupling function, light incoupling function, light diffracting function, light refracting function, light directing function, light diffusing function, light scattering function, light collimation function, optical function, lens function, mirror function, sampling function, optical sampling function, measurement function, sensing function, attaching function, mounting function, alignment function, hanging function, boss-base feature, connector, snap connector or fastener, and clip connector. Instead of or in addition to light, corresponding functionalities may be implemented having regard to other type (e.g. wavelength) of radiation. A protrusion may thus establish at least part of a boss-base, fastener, sample bowl, collimator, diffuser, lens, prism, window, tower light, etc.

In one, either supplementary or alternative, embodiment the substrate contains at least one element for guiding the molten plastics therethrough selected from the group consisting of: cut, slit, through cut, blind (non-through) cut, hole, through-hole, thinned portion with substrate material locally removed, and a weakened portion optionally without substrate material removed. The substrate may thus be of constant or varying thickness upon molding, for example. The elements may be on either side of the substrate (i.e. the first side directly facing the molten plastics, and/or the second side whereto the plastics is supposed to subsequently propagate through the substrate).

Alternatively or additionally, the substrate could contain feature(s) strengthening the selected portion(s) thereof to prevent the plastic to penetrate through them. The feature(s) could include additional material layers of substrate and/or other, optionally more durable (e.g. hard or rigid), material.

In some embodiments, the locations of the substrate serving as feed-through points of the molded plastics do not differ from the adjacent portions substantially in any manner. Instead, the feed-through locations may be spatially (solely) configured by appropriate mold shapes on the second side of the substrate. For example, a recess or hole or some other applicable mold feature at a desired location relative to the substrate may cause the plastic to push through the substrate at that particular location due to the lack of support by the backing mold to the substrate thereat. The shape and dimensions of the mold form (e.g. convex, concave, circular, angular, elongated, etc.) thus define the corresponding measures of the functional protrusions established, which applies to basically each embodiment wherein e.g. injection molding is utilized to push the plastics through the substrate against a mold surface, also including the embodiments where the aforementioned elements (cuts, holes, etc.) are used.

Additionally or alternatively, in some embodiments a predetermined, potentially a sharp-pointed element (e.g. nail, screw or stick type element) and/or a hollow element (e.g. bush type element) could be positioned on the first side/surface of the substrate prior to molding to penetrate through the substrate due to the pressure thereon introduced by the molten plastic during molding. Accordingly, the penetrated portion of the element as well as protruded plastics could then establish the desired functional protrusion. For example, core or border element of the protrusion could be established from such element. The element could thus contribute to establishing the feed-through at a desired location on the substrate.

In one, either supplementary or alternative, embodiment the first side and preferably first surface of the substrate contains graphics and/or electronics optionally embedded within the molded plastics, said electronics including at least one feature selected from the group consisting of: trace, printed trace, contact pad, component, integrated circuit (chip), light emitting device, light sensing device, photodiode, diode, OLED (Organic LED), printed electronic component, antenna, accelerometer, gyroscope, capacitive switch or sensor, and photovoltaic cell. Electronics may be printed by means of printed electronics technology (e.g. screen printing or ink jetting, or other additive methods) and/or mounted.

In some embodiments, the substrate has been formed prior to molding. The substrate may have been formed, preferably through thermoforming, to a desired substantially three-dimensional (non-planar) shape. At least some of the electronics may have been provided to the substrate prior and/or subsequent to forming.

The first side and thus the associated first surface of the substrate has thus been at least partially, having regard to the related surface area, overmolded by plastic, preferably and typically thermoplastic, material. Optionally, several overmolding-applicable materials may be utilized to establish one or more molded layers, e.g. adjacent layers lying side-to-side on the first side of the substrate and/or forming a stack of multiple superposed layers thereon. At least one of the molded materials defines, at least partly, the protrusions established on the second side.

Optionally, additional layer or e.g. film has been provided on the other side of the molded layer(s). This layer such as a film, which may further act as a substrate for graphics and/or electronics, such as electronic components and/or traces, therefore faces the molded layer from a direction opposite to the primary substrate. The second film may have been positioned, i.e. inserted, in a mold together with the first film enabling plastic material to be injected between them. Alternatively, the second film may have been laminated onto the molded layer by feasible lamination technology using e.g. adhesive, elevated temperature and/or pressure based bonding.

In some embodiments, the (thermo)plastic material used to establish the molded layer(s) and at least part of the protrusions comprises optically substantially opaque, transparent or translucent material enabling e.g. visible light to pass through it with negligible loss. The sufficient transmittance at desired wavelengths may be about 85%, 90% or 95% or higher, for example. Possible further molded (thermo)plastic material may be substantially opaque or translucent. In some embodiments, the further material may be transparent.

In a further, either supplementary or alternative, embodiment one or more of the included (substrate) films such as plastic, metallic, textile or generally fibrous films may at least partially be optically substantially opaque or at least translucent having regard to predefined wavelengths e.g. in visible spectrum. The film may have been initially provided with visually distinguishable, decorative/aesthetic and/or informative, features such as graphical pattern and/or color thereon or therein. The features may have been provided on the same side of the film with the electronics so that they have been also sealed by the plastic material(s) through the associated overmolding procedure. Accordingly, IML (in-mold labeling)/IMD (in-mold decoration) technique is applicable. The film(s) may be at least partially, i.e. at least in places, optically transparent or translucent to radiation such as visible light emitted by the electronics thereon. The transmittance may be about 85%, 90%, 95% or higher, for example.

A device such as electronic device comprising an embodiment of the multilayer structure may be provided. The device may implement a sensing or sampling function such as fluid, liquid or gas sensing or sampling function. It may have radiation such as light transmitting or receiving function. It may be or incorporate a vehicle. Alternatively, the multilayer structure may find use in various elements of an infrastructure and e.g. buildings.

According to one other embodiment, a method for manufacturing a multilayer structure for an electronic device, comprises obtaining a substrate film capable of accommodating electronics, said film having a first side and second side, preferably printing a number of conductive traces, and optionally electronic components, on the first side of the substrate to establish a predetermined circuit design, molding a layer of plastic onto the first side of the substrate so that it protrudes through the substrate onto the second side and forms thereat one or more protrusions preferably having at least one predetermined function.

Molding action may naturally include further preparatory or related activities such as manufacturing a mold and/or placing the substrate in the mold in a predetermined position so that the desired portions are overmolded by plastic material with preferred properties such as layer thicknesses. The substrate may be formed to exhibit a desired three-dimensional (substantially non-planar) shape prior to overmolding of plastic.

In one embodiment, the method further comprises preparing the substrate so as to contain at least one feature for enabling the molded plastic penetrate to the second side of the substrate substantially at/through the location of the feature, selected from the group consisting of: cut, slit, through cut, blind (non-through) cut, hole, through-hole (optionally very small hole, or 'pinhole'), thinned portion with substrate material locally removed, and a weakened portion optionally without substrate material removed.

The feature may be provided by drilling, carving, sawing, etching, cutting (e.g. with laser or mechanical blade), or using any other feasible processing method as being understood by a person skilled in the art.

The feature may have a desired shape, i.e. a substantially circular or angular hole, or a flat and/or narrow slit, may be established. It may substantially have (side) cross-section of a parallelogram, for example, or it may practically be described as a narrow slit. It may bear rounded shape(s) to enable flexible connector to bend in contact therewith without additional slack.

In some embodiments, the method comprising positioning a potentially sharp-pointed element on the first side of the substrate, e.g. on the corresponding first surface thereof, so that the pressure of the plastic directs the element at least partially through the substrate to the second side thereof. The element may thus optionally at least assist in establishing the through-hole or slit to the second side as contemplated hereinbefore.

Preferably the aforesaid element or feature is aligned with a matching mold feature such as a recess with desired dimensions and shape so that there's room for the molten plastic to enter the second side of the substrate and establish a protrusion of predefined nature.

The shape of the protrusion may incorporate or define e.g. a cone, a truncated cone, cube shape, pyramidal shape, frustum, prism, dome, pole, barb/jag, hook, fluke, etc. depending on the embodiment.

As mentioned hereinbefore, also features strengthening certain area(s) of the substrate to prevent plastic feed-through via them could be provided.

In some embodiments, the method involves controlling the molding of plastic so that the plastic hits the first side of the substrate with predefined target angle, for example, which may affect the geometry and other properties of the through-hole introduced or enlarged therein. It may also affect the properties of the established protrusion.

A number of electronic components may be provided, by printing and/or mounting, for example, on the first side of the substrate film to establish the desired circuit thereon, which may have control, measurement/sensing, sampling, UI, data processing, storage, etc. purpose.

Optionally a further, second film may be provided on the other side of the molded plastic as mentioned hereinbefore. It may be located in a mold as well together with the primary first substrate carrying the flap so that a stacked structure is obtained by injecting the plastic material in between, or the second film may be provided afterwards using a suitable lamination technique if not being directly manufactured on the molded plastic layer. The second film may have electronics on any side thereof as well as e.g. graphics (application of IMD/IML technique thus possible). Yet, it may have a protective purpose and/or other technical features such as desired optical transmittance, appearance (e.g. color) or feel.

The feasible molding methods include e.g. injection molding. In case of several plastic materials, they may be molded using a two-shot or generally multi-shot molding method. A molding machine with multiple molding units may be utilized. Alternatively, multiple machines or a single re-configurable machine could be used for sequentially providing several materials.

The previously presented considerations concerning the various embodiments of the structure or hosting device may be flexibly applied to the embodiments of the method mutatis mutandis, and vice versa, as being appreciated by a skilled person.

The utility of the present invention arises from a plurality of issues depending on the embodiment.

By the suggested method, highly integrated, durable, compact, thin, complex, affordable and/or light multilayer structures with desired functionalities, one or more which being at least partly arranged by the protrusions of molded plastics on the side opposite to the molding side of the plastic relative to the substrate, can be manufactured. The functionality of the protrusions may vary between the embodiments but generally they are applicable to various sensing, measurement, transmitting, receiving and attachment or alignment purposes, for example. The manufacturing process is efficient as additional method steps for preparing the protrusions are not necessary, and already existing manufacturing equipment may in most cases be utilized without need to invest in pricey special gear.

In fact, preparations of the manufacturing process may in some embodiments only, or mainly, incorporate establishing a number of recesses in a mold so that the molten plastic will protrude through the substrate corresponding to their location and ultimately fill the recess(es) to create the protrusion(s). Producing different products and product variants becomes effortless as just the mold requires modification instead of a need to modify or utilized a greater number of different process tools and process steps.

Even if (non-through) cuts, such as grooves, are to be formed in the substrate for guiding/facilitating the flow of plastic through the substrate, the procedure remains somewhat convenient (simple and rapid) in contrast to establishing more complex shapes in the substrate material, such as through-holes with stringent dimension and shape accuracy requirements, which also requires using more complex tools instead of simple and easily modifiable cutting tools enough for preparing the cuts.

If through holes can be avoided in the substrate prior to forming, very efficient and precise forming methods such as pressure forming, can also be utilized to their full potential. Otherwise, the pressure may easily escape through the holes.

Generally, the obtained multilayer structure may be used to establish a desired device or module in a host device or generally element such as an intelligent garment (e.g. shirt, jacket, or trousers, or e.g. a compression garment), other piece of wearable electronics (e.g. wristop device, headwear, or footwear), vehicle, personal communications device (e.g. smartphone, phablet or tablet), measurement apparatus, or other electronics/devices. The integration level of the obtained structure may be high and desired dimensions such as the thickness thereof small.

The used film(s) may contain graphics and other visually and/or tactilely detectable features thereon, whereupon the film may have aesthetic and/or informative effect in addition to hosting and protecting the electronics. The film(s) may be translucent or opaque at least in places. They may be of desired color or comprise portions of desired color. The obtained multilayer structure may thus incorporate one or more color/colored layers that optionally determine graphics such as text, pictures, symbols, patterns, etc. These layers may be implemented by dedicated films of certain color(s), for instance, or provided as coatings (e.g. through printing) on existing film(s), molded layer(s), and/or other surfaces.

The film(s) may be configured to establish at least a portion of outer and/or inner surface of the associated product.

The visual features such as patterns or coloring may be provided via internal layers, e.g. on the side of the first and/or second film that is facing the molded plastic so that the features remain isolated and thus protected from the environmental effects at least by the thickness of the film. Accordingly, different impacts, rubbing, chemicals, etc. that could easily damage e.g. painted surface features do not normally reach them. The film may be easily manufactured or processed, optionally cut, into a desired shape with necessary characteristics such as holes or notches for exposing the underlying features such as the molded material and/or for facilitating the penetration of molten plastic through the film.

The molded thermoplastic material(s) may be optimized for various purposes including securing electronics in view of the molding process. Yet, the material may be configured to protect the electronics from e.g. environmental conditions such as moisture, heat, cold, dirt, shocks, etc. It may further have desired properties in view of light transmittance, permeability and/or elasticity, for example. In case the embedded electronics includes light- or other radiation-emitting or receiving components, the material may have sufficient transmittance to enable light transmission therethrough.

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

The terms "film" and "foil" are herein used generally interchangeably, unless otherwise explicitly indicated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION OF THE INVENTION

Figure 1:
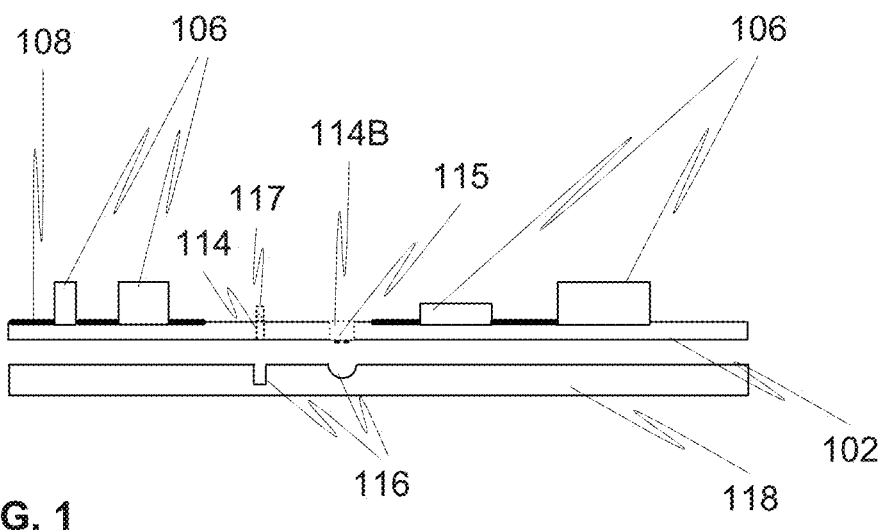
FIG. 1 illustrates one embodiment of a multilayer structure in accordance with the present invention prior to molding.

FIG. 1 illustrates, via a cross-sectional side view, an embodiment 100 of a multilayer structure prior to molding, i.e. unfinished multilayer structure, essentially comprising at least a substrate element 102, and mold (half) 118. The finished multilayer structure may establish an end product of its own, e.g. electronic device or element, or be disposed in a host device as an aggregate part or as a module.

The structure 100 comprises a (first) substrate film 102 such as flexible plastic film to accommodate electronics, such as electrically conductive traces 108 (defining e.g. conductor lines, contact pads, associated patterns, etc.) and preferably also components 106, printed on a first side and respective surface thereof by means of printed electronics technology, such as screen printing, flexography or ink jetting. The printed elements incorporating at least the traces 108 are configured so as to establish a desired circuit design. Also decorative or indicative printing may be provided on the film 102.

In addition to or instead of printed versions, the components may include ready-made components (surface-) mounted on the substrate 102, such as so-called surface-mounted elements. For example, adhesive may be utilized for mechanically securing the electronics 508 on the substrate. Conductive materials such as conductive adhesive and/or solder may be applied for establishing electrical and also mechanical connections.

Figure 2:
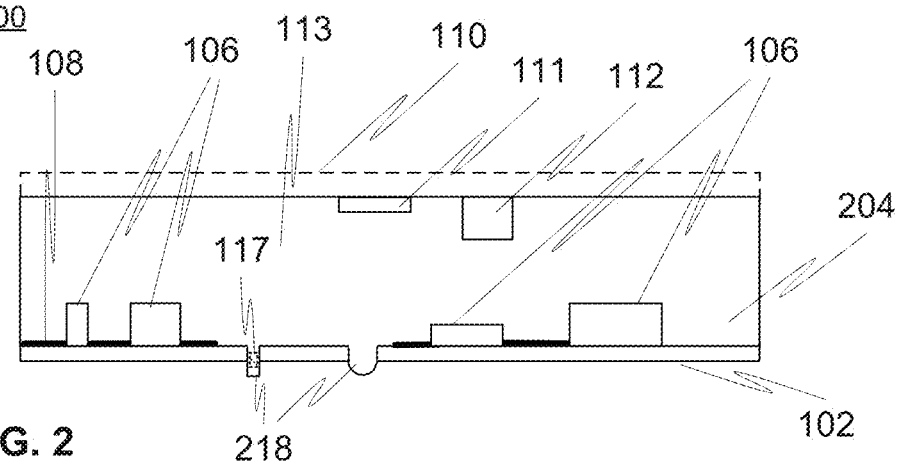
FIG. 2 illustrates the embodiment of FIG. 1 after molding.

The substrate 102 and electronics 106, 108 are to be at least partially covered by at least one molded plastic layer 204 as shown in FIG. 2 to form a multilayer structure 200.

An optional second film 110 of same or different material with the first film 102 may be present in the multilayer stack as well. The film 110 may accommodate electronics 112, graphics 111 and/or other features considered advantageous. Further film, coating, etc. may be optionally provided on the second film 110 e.g. for aesthetic, protective/insulating or other purposes.

Reference numerals 114 and 114B indicate two target locations for the molten plastics to proceed through the substrate from the first, actual molding side (top side in the figure) to the opposite second side (bottom side in the figure). Depending on the embodiment, as being described hereinbefore, the locations 114, 114B may be optionally provided with elements 117, 115 that facilitate the molten plastic to propagate through the substrate 102 (e.g. cuts, slits, holes) and/or establish internal or visible feature of the resulting protrusion (e.g. element 117 initially positioned on the first side/surface of the substrate 102), such as (metal) bushing, core or support.

The mold 118 is preferably provided with a number of surface features 116 such as recesses, which may accommodate the molten plastic penetrated through the substrate 102 during molding to establish the desired protrusion(s) 218 from the molded plastic. The mold 118 and e.g. recesses 116 therein, may be provided with optionally removable sub-elements such as potentially screwable protrusion like elements to establish more complex protrusion forms 218 from the contacting molten plastic. E.g. a centered protrusion in the middle of a mold recess may establish a central recess in the molded protrusion 218 of the manufactured multilayer structure.

The protrusions 218 may further be provided with additional features such as (functional) coatings.

Figure 3:
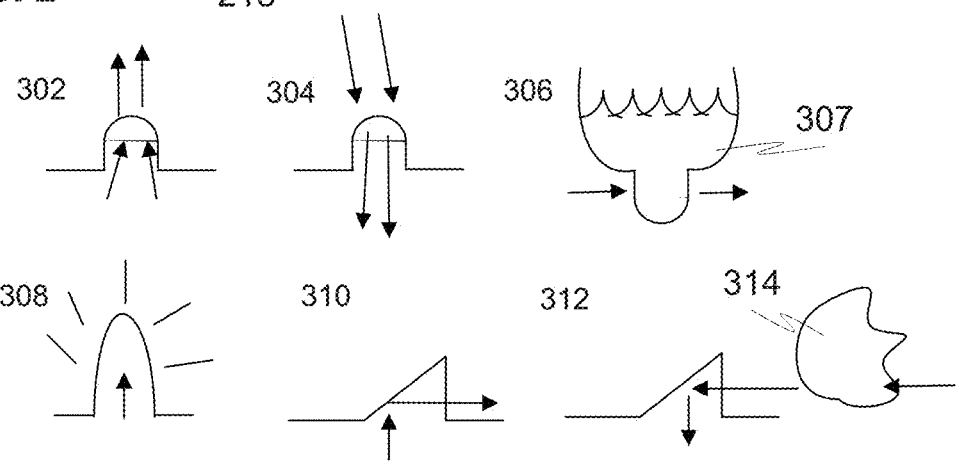
FIG. 3 illustrates different shapes and functionalities the various embodiments of the established protrusions may be configured to provide.

The protrusions 218 may implement a great variety of different functionalities some of which are briefly reviewed in FIG. 3. For mechanical attachment and/or alignment of the multilayer structure relative to a target surface, the protrusions 218 may have been shaped and dimensioned, by the proper design of mold shapes 116 etc., so that the resulting forms match the target surface geography in a desired fashion. For example, the protrusions 218 may be arranged to fit matching or compatible recesses of the target surface (not shown, but generally the shapes such as recesses of the target surface may thus remind of the ones of the mold 118).

FIG. 3 illustrates different functionalities the various embodiments of the established protrusions may implement in addition to or instead of aesthetic, decorative or purely mechanical (fixing, alignment, etc.) possibilities.

At 302, the protrusion establishes an optical feature such as a lens for transmitting electromagnetic radiation such as light from within the multilayer structure, e.g. LED or other light source embedded therein.

At 304, the protrusion establishes an optical feature such as a lens for receiving or 'capturing' light and transmitting/coupling it inside the structure, optionally to a light-sensitive element such as a photodiode.

At 306, the protrusion establishes a part of a sample bowl for retaining fluid 307 such as desired liquid. The part may function as an optical sample channel for external radiation such as light to interact and/or pass through for measuring or process purposes, for example.

At 308, a light tower or other light outcoupling structure emitting light, or radiation of other wavelength, to the environment from a source within the multilayer structure has been established utilizing the protrusion.

At 310, a prism shape has been established to refract light upon outcoupling.

At 312, prism has been established to incouple/capture incident light passed through fluid such as gas 314 for related measurement purposes by element(s) within the multilayer structure, for instance.

Prism(s) could also be prepared from protrusions and used to break light up into colors, reflect light or split the light into (polarization) components.

In the above-described and other embodiments, the protrusions may be optically substantially transparent, translucent or even opaque having regard to different predefined wavelengths.

Having regard to few examples of the applicable material selections, the film(s) 102, 110 may substantially consist of or comprise at least one material selected from the group consisting of: polymer, thermoplastic material, PMMA (Polymethyl methacrylate), Poly Carbonate (PC), polyimide, a copolymer of Methyl Methacrylate and Styrene (MS resin), glass, Polyethylene Terephthalate (PET), and metal.

In some embodiments, the film(s) 102, 110 may include or be coated or covered by further materials/material layers e.g. on the side facing the environment (i.e. not the electronics 106, 108, 112 and molded material 104). E.g. textile or biological or bio-based materials (e.g. leather, wood, paper, cardboard) in addition to or instead of more conventional layers may be provided. Also e.g. rubber or generally rubberous material may be used. Such layers may have different functionalities, such as a protective function, characterizing desired feel, aesthetic or particular desired light transmissive and/or reflective function and/or indicative function. These layers may be provided with features spatially and/or functionally matching/compatible with the protrusions 218, such as recesses, holes, etc.

The plastic layer(s) 104, provided by the overmolding procedure, may generally incorporate e.g. elastomeric resin. In more detail, the layer(s) 104 may include one or more thermoplastic materials that include at least one material selected from the group consisting of: PC, PMMA, ABS, PET, nylon (PA, polyamide), polypropylene (PP), polystyrene (GPPS), and MS resin.

The electronics 106, 112 may include one or more components, such as passive components, active components, ICs (integrated circuit), and/or sub-assemblies (one or more components first provided on a separate substrate, subsequently attached as a whole to the target substrate 102, 110).

In more detail, the electronics 106, 112 may include at least one element selected from the group consisting of: optoelectronic component, microcontroller, microprocessor, signal processor, DSP (digital signal processor), sensor, programmable logic chip, memory, transistor, resistor, capacitor, inductor, memory array, memory chip, data interface, transceiver, wireless transceiver, transmitter, receiver, wireless transmitter, and wireless receiver.

As mentioned above, the electronic components carried by the structure may include at least one optoelectronic component. The at least one optoelectronic component may include a LED (light-emitting diode), an OLED (organic LED), or some other light-emitting component, for example. The components may be side-emitting ('side shooting'). Alternatively or additionally, it may include light-receiving or light-sensitive component such as a photodiode, photoresistor, other photodetector, or e.g. a photovoltaic cell. The optoelectronic component such as OLED may have been printed on the substrate film 102, 110 using a preferred method of printed electronics technology.

For example, different sensing/measurement, emitting, receiving and/or other functionalities may be implemented by the embedded ICs, dedicated components, or shared ICs/electronics (multi-purpose electronics).

The film(s) 102, 110 may be shaped according to the requirements set by each use scenario. They 102, 110 may exhibit e.g. a rectangular, circular, or square general shape. They 102, 110 may further contain recesses, notches, cuts or openings for various purposes such as attachment to other elements, fitting electronics or other components, provision of passages for light or other radiation, fluid, etc.

Figure 4:
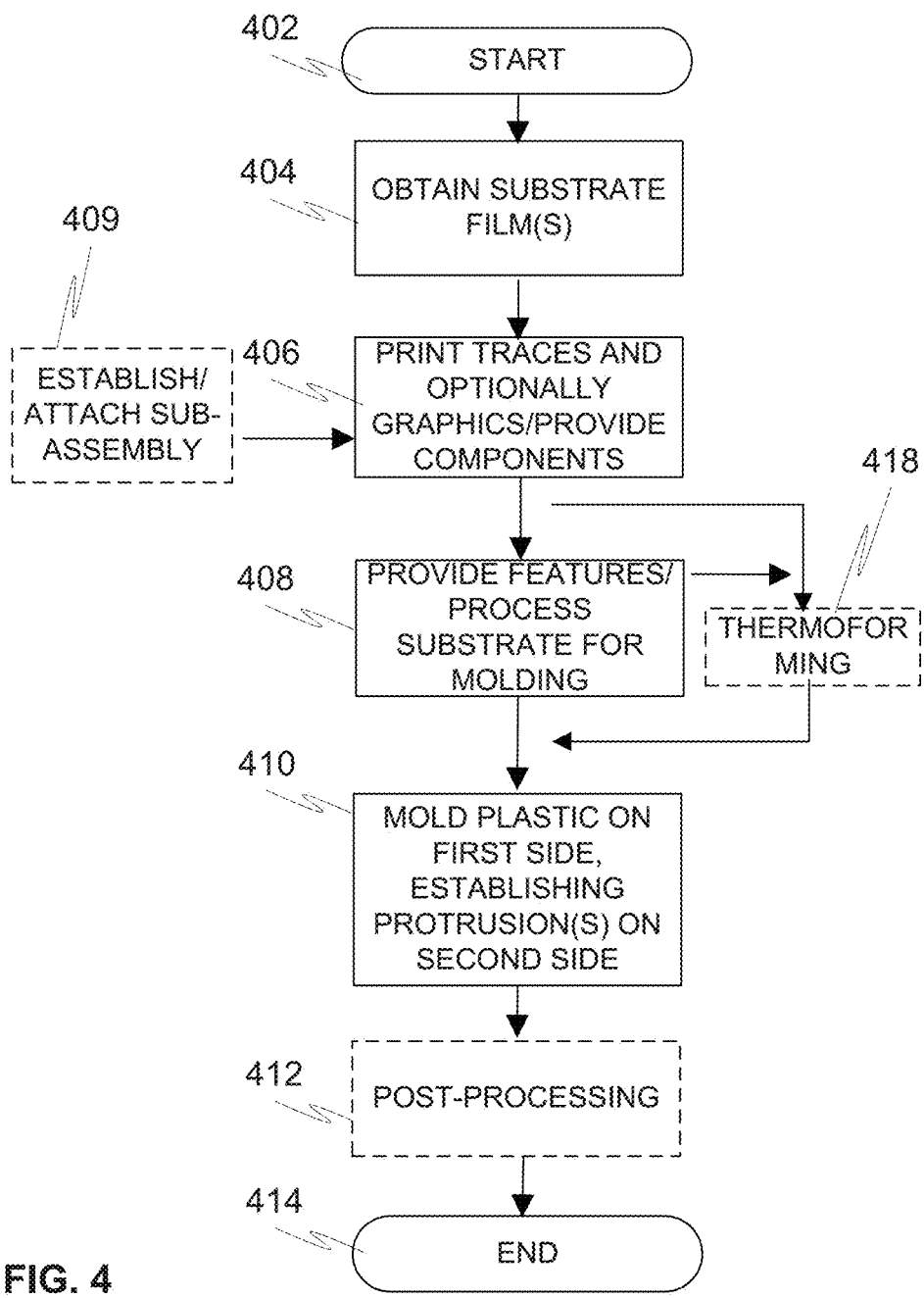
FIG. 4 is a flow diagram disclosing an embodiment of a method in accordance with the present invention.

FIG. 4 includes a flow diagram 400 disclosing an embodiment of a method in accordance with the present invention.

At the beginning of the method for manufacturing the multilayer structure, a start-up phase 402 may be executed. During start-up 402, the necessary tasks such as material, component and tools selection, acquisition, calibration and other configuration may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, thermoforming, cutting, drilling and/or printing equipment, among others, may be thus ramped up to operational status at this stage. Mold(s) may be prepared with necessary surface forms, etc.

At 404, at least one, preferably flexible, substrate film or other preferably planar substrate for accommodating electronics is obtained. A ready-made element of substrate material, e.g. roll of plastic film, may be acquired. In some embodiments the substrate film itself may be first produced in-house by molding or other methods from the desired starting material(s). Optionally, the substrate film is processed. It may be, for example, coated and/or provided with openings, notches, recesses, cuts, etc. as contemplated hereinbefore.

At 406, a number of conductive traces defining e.g. conductor lines, contact pads (or other contact areas), etc. for electrically coupling electronic components, are provided on the film(s), preferably by one or more techniques of printed electronics with reference to related additive technologies. For example, screen, inkjet, flexographic, gravure or offset lithographic printing may be utilized. Also further actions cultivating the film(s) involving e.g. printing of graphics, visual indicators, etc. on the film(s) may take place here.

Further electronics and/or material non-adherent to molded plastics may be arranged on the substrate optionally by printing.

Ready-made components such as various SMDs may be attached to the contact areas by solder and/or adhesives. Alternatively or additionally, printed electronics technology may be applied to actually manufacture at least part of the components, such as OLEDs, directly onto the film(s).

At 408, the substrate may be optionally provided with elements/features affecting the generation of plastic feedthroughs upon molding. They may be introduced to the first and/or second surfaces of the substrate as discussed hereinbefore. For example, non-through cuts may be formed in the substrate at locations where the molded plastic should proceed therethrough. The cuts may facilitate the plastic flowing through the substrate appropriately. Item 408 could be optionally executed in connection with or prior to item 406.

In some embodiments, prior to molding of plastic top layer the substrate film(s) optionally already containing electronics provided in 406, such as traces and/or mounted components (e.g. chip(s)), may be formed to a desired 3d-shape, preferably through thermoforming 418 such as vacuum or pressure forming. The substrate containing thermoformable material may be shaped to better fit the target environment/device or target use. Additionally or alternatively, thermoforming could even take place after molding in case the already-established multilayer stack is designed to survive such processing.

Having regard to forming techniques, e.g. pressure forming may be applied to provide the substrate with preferred properties such as very precise, sharp details. Pressure forming is generally preferred when the substrate lacks (through-) holes that could enable undesired flow and resulting pressure drop via them.

In some embodiments, a number of sub-assemblies of electronics/sub-substrates may be provided as such to the primary substrate at 409 and secured by adhesive, for instance.

At 410, thermoplastic layer is molded upon the first side of the substrate film and electronics thereon, such as traces and a number of electronic components. In practice, the substrate film may be used as an insert in an injection molding process. The first side and associated surface of the substrate element may be, in some embodiments, left with one or more areas free from the molded plastics. As the molten plastic controllably penetrates to the second side of the substrate, a number of associated protrusions with desired properties are created.

In case, two films are used, both of them may be inserted in their own mold halves so that the plastic layer is injected between them. Alternatively, the second film could be attached to an aggregate of first film and plastic layer afterwards by suitable lamination technique.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about 1 mm, but considerably thicker or thinner embodiments are also feasible.

Item 412 refers to possible post-processing tasks. Further layers may be added into the multilayer structure and e.g. protrusion(s) by lamination or suitable coating (e.g. deposition) procedure. The layers may be of indicative or aesthetic value (graphics, colors, figures, text, numeric data, etc.) and contain e.g. textile, leather or rubber materials instead of or in addition to further plastics. Additional elements such as electronics may be installed at the outer surface(s) of the structure, such as the exterior surface of the substrate or the protrusion(s). Shaping/cutting may take place.

At 414, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For instance, instead of printed traces, the traces could be produced/provided otherwise. E.g. a conductor film manufactured utilizing etching, for example, could be applied.

The invention claimed is:

1. A multilayer structure comprising:
   a flexible substrate film having a first side and a second side, the flexible substrate film being capable of accommodating electronics, conductive traces, and electronic components such as SMDs (surface-mount device), on the first side thereof, and
   a plastic layer molded onto the first side of the flxible subtrate film and protruding at one or more locations through the flexible substrate film onto the second side, forming one or more protrusions on the second side having a predetermined function.

2. The structure of claim 1, wherein the one or more of the protrusions have been configured to implement at least part of at least one feature or function selected from the group consisting of:
   light transmitting function, light receiving function, prismatic function, light coupling function, light outcoupling function, light incoupling function, light diffracting function, light refracting function, light directing function, light diffusing function, light scattering function, light collimation function, optical function, lens function, mirror function, sampling function, measurement function, sensing function, optical sampling function, attaching function, mounting function, alignment function, hanging function, boss-base feature, connector, snap connector or fastener, and clip connector.

3. The structure of claim 2, wherein the flexible substrate film includes at least one element to enable molten plastics of the plastic layer to flow through the flexible substrate film substantially at the location of the feature, the at least one element being selected from the group consisting of:
   cut, slit, through cut, blind cut, hole, through-hole, and thinned portion with substrate material locally removed.

4. The structure of claim 3, wherein the at least one element is located on the first and/or second side of the substrate.

5. The structure of claim 1, further comprising electronics on the first side of the flexible substrate film, at least partially embedded within the plastic layer, wherein the electronics comprise at least one element selected from the group consisting of:
   trace, printed trace, contact pad, component, surface mount device (SMD), integrated circuit (chip), light emitting device, light sensing device, photodiode, diode, OLED (Organic LED), printed electronic component, antenna, accelerometer, gyroscope, capacitive switch or sensor, and photovoltaic cell.

6. The structure of claim 1, comprising a further film provided upon the molded plastic layer, the further film carrying graphics and/or electronics.

7. The structure of claim 1, wherein the flexible substrate film includes at least a weakened portion where substrate material is substantially removed to enable molten plastics of the plastic layer to protrude and flow through the flexible substrate film at the location thereof.

8. A method for manufacturing a multilayer structure for an electronic device, the method comprising:

obtaining a substrate film capable of accommodating electronics, the substrate film having a first side and second side providing, through utilization of printed electronics technology, a number of conductive traces and at least one electronic component on the first side of the substrate to establish a predetermined circuit design, and molding a layer of plastic onto the first side of the substrate so that at least a portion of the layer of plastics protrudes through the substrate film onto the second side and forms thereat one or more protrusions having at least one predetermined function.

9. The method of claim 8, wherein a mold with a recess substantially at a location corresponding to a target location of the protrusion point is obtained.

10. The method of claim 9, further comprising preparing the substrate film so as to include at least one feature facilitating the penetration of molded plastic of the layer of plastic to the second side of the substrate film substantially at a location of the feature, selected from the group consisting of:

cut, slit, through cut, blind cut, hole, through-hole, and thinned portion with substrate material locally removed.

11. The method of claim 9, wherein the molding includes injection molding.

12. The method of claim 9, incorporating forming of the substrate film to achieved a predetermined substantially three-dimensional shape, the forming incorporating thermoforming or pressure forming.

13. The method of claim 8, further comprising preparing the substrate film so as to include at least one feature facilitating the penetration of molded plastic of the layer of plastic to the second side of the substrate film substantially at a location of the feature, selected from the group consisting of:

cut, slit, through cut, blind cut, hole, through-hole, and thinned portion with substrate material locally removed.

14. The method of claim 13, wherein the molding includes injection molding.

15. The method of claim 13, incorporating forming of the substrate film to achieved a predetermined substantially three-dimensional shape, the forming incorporating thermoforming or pressure forming.

16. The method of claim 8, wherein the molding includes injection molding.

17. The method of claim 16, incorporating forming of the substrate film to achieved a predetermined substantially three-dimensional shape, the forming optionally incorporating thermoforming or pressure forming.

18. The method of claim 8, incorporating forming of the substrate film to achieved a predetermined substantially three-dimensional shape, the forming incorporating thermoforming or pressure forming.

19. The method of claim 18, wherein the 3D-forming of the substrate is executed after the provision of the number of conductive traces and the at least one electronic component on the substrate film.

20. The method of claim 8, wherein the substrate film is prepared, prior to molding, so as to include at least a weakened portion where substrate material is substantially removed, facilitating the penetration of molded plastic of the layer of plastic to the second side of the substrate film substantially at the location thereof.

* * * * *